United States Patent
Shimizu

(10) Patent No.: US 8,870,164 B2
(45) Date of Patent: Oct. 28, 2014

(54) SUBSTRATE PROCESSING METHOD AND STORAGE MEDIUM

(75) Inventor: Wataru Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 697 days.

(21) Appl. No.: 13/008,133

(22) Filed: Jan. 18, 2011

(65) Prior Publication Data

US 2011/0177695 A1 Jul. 21, 2011

Related U.S. Application Data

(60) Provisional application No. 61/304,158, filed on Feb. 12, 2010.

(30) Foreign Application Priority Data

Jan. 20, 2010 (JP) ................. 2010-010278

(51) Int. Cl.
| | | |
|---|---|---|
| H01B 13/00 | (2006.01) | |
| H01L 21/302 | (2006.01) | |
| H01L 21/461 | (2006.01) | |
| H01J 37/32 | (2006.01) | |
| H01L 21/3105 | (2006.01) | |
| H01L 21/768 | (2006.01) | |
| H01L 21/683 | (2006.01) | |
| H01L 21/311 | (2006.01) | |
| H01L 21/67 | (2006.01) | |

(52) U.S. Cl.
CPC ....... *H01L 21/6831* (2013.01); *H01J 37/32165* (2013.01); *H01L 21/31116* (2013.01); *H01L 21/3105* (2013.01); *H01L 21/76814* (2013.01); *H01J 37/32091* (2013.01); *H01L 21/76826* (2013.01); *H01L 21/76808* (2013.01); *H01L 21/67069* (2013.01)

USPC ............................................. 261/17; 438/710

(58) Field of Classification Search
USPC ........ 216/13, 17, 58, 67, 74, 76, 78; 438/689, 438/706, 707, 710, 716, 720, 725
See application file for complete search history.

(56) References Cited

U.S. PATENT DOCUMENTS

| | | | |
|---|---|---|---|
| 2003/0181034 A1* | 9/2003 | Jiang et al. | 438/638 |
| 2003/0224595 A1* | 12/2003 | Smith et al. | 438/637 |
| 2007/0275560 A1* | 11/2007 | Nishimura et al. | 438/694 |

(Continued)

FOREIGN PATENT DOCUMENTS

| | | | |
|---|---|---|---|
| JP | 2000-091428 A | 3/2000 | |
| JP | 2006-019601 A | 1/2006 | |
| JP | 2007-080850 A | 3/2007 | |
| JP | 2007-250861 A | 9/2007 | |
| JP | 2009-010043 A | 1/2009 | |

(Continued)

*Primary Examiner* — Binh X Tran
*Assistant Examiner* — Thomas Pham
(74) *Attorney, Agent, or Firm* — Pearne & Gordon LLP

(57) ABSTRACT

A recovery process of a damaged layer and a reducing process of an oxide are performed on a substrate in which the oxide and the damaged layer from which carbon has been eliminated are formed on exposed surfaces of a Cu wiring and a SiCOH film as a low-k film, respectively. In the same processing chamber 51, a recovery process of a damaged layer 15 and a reducing process of an oxide/fluoride layer 16 are performed on a wafer W in which the damaged layer 15 from which carbon has been eliminated and the oxide/fluoride layer 16 are formed on exposed surfaces of an interlayer insulating film 4 containing SiCOH and a wiring 2 containing Cu, respectively, by consecutively supplying $H_2$ gas and TMSDMA gas containing silicon and carbon in sequence.

6 Claims, 9 Drawing Sheets

(56) References Cited

U.S. PATENT DOCUMENTS

2008/0194115 A1* 8/2008 Kubota et al. ............ 438/765
2008/0318412 A1* 12/2008 Iba ........................... 438/627
2009/0001046 A1* 1/2009 Kubota et al. ............ 216/13
2009/0014414 A1* 1/2009 Tomioka et al. .......... 216/41

FOREIGN PATENT DOCUMENTS

| | | |
|---|---|---|
| JP | 2009-164471 A | 7/2009 |
| JP | 2009-170547 A | 7/2009 |

* cited by examiner

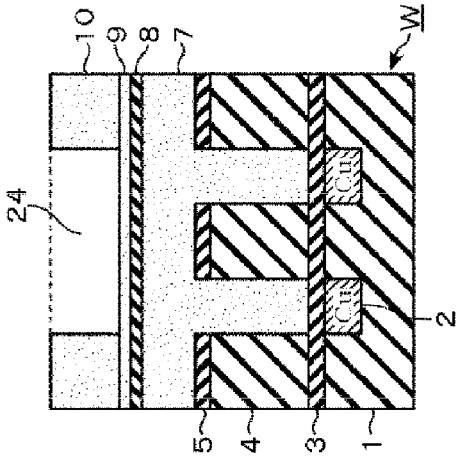
FIG. 2A
ETCHING PROCESS OF INTERLAYER INSULATING FILM
(PLASMA CONTAINING F AND O)
FIG. 2B
FIG. 2C
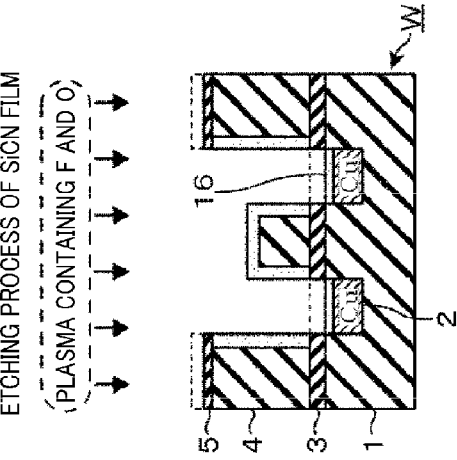
FIG. 2D
FIG. 2E
ASHING PROCESS OF ORGANIC FILM
(PLASMA CONTAINING O)
FIG. 2F
ETCHING PROCESS OF SiCN FILM
(PLASMA CONTAINING F AND O)

- 6a
- 6
- 5
- 4 INTERLAYER INSULATING FILM
- SiCOH
- Cu
- 1 INTERLAYER INSULATING FILM
- 2 WIRING
- W WAFER

SUBSTRATE PROCESSING METHOD AND STORAGE MEDIUM

CROSS-REFERENCE TO RELATED APPLICATION

This application claims the benefit of Japanese Patent Application No. 2010-010278 filed on Jan. 20, 2010, and U.S. Provisional Application Ser. No. 61/304,158 filed on Feb. 12, 2010, the entire disclosures of which are incorporated herein by reference.

FIELD OF THE INVENTION

The present disclosure relates to a substrate processing method for performing a recovery process on a damaged layer formed on an exposed surface of a low-k film containing carbon and oxygen on a substrate and a storage medium for storing therein the substrate processing method.

BACKGROUND OF THE INVENTION

In a process for forming a multilayer interconnection structure of a semiconductor device, a plasma etching process for forming a recess such as a groove or a via hole of a damascene structure in an interlayer insulating film by using a photoresist film containing an organic material may be performed in order to form a conductive layer for connecting an upper and a lower wiring layer such as Cu via an interlayer insulating film formed of, e.g., SiOCH (compound containing silicon, oxygen, carbon and hydrogen) on a semiconductor wafer. Further, a SiCOH film having a dielectric constant lower than a $SiO_2$ film is referred to as a low-k film.

A stopper film such as a SiCN (silicon carbonitride) film is formed between the interlayer insulating film and the lower wiring layer to thereby form a recess having a uniform depth within the interlayer insulating film of the wafer and reduce damages on the Cu surface. After the recess is formed in the interlayer insulating film, a plasma etching process such as brake is performed on the stopper film by using a processing gas containing, e.g., F (fluorine), as described in Patent Document 1, in order to expose an underlying Cu (wiring layer). Besides, a plasma processing may be performed using a processing gas containing O (oxygen). Thereafter, a cleaning process using, e.g., a liquid chemical, is performed and, then, a conductive layer is buried in the recess of the interlayer insulating film.

However, as described in Patent Document 2, a damaged layer having dangling bonds due to elimination of, e.g., C (carbon), is formed on a portion of the interlayer insulating film which contacts with the plasma by the plasma processing. When the wafer is transferred in a vacuum atmosphere or an atmospheric atmosphere, a small amount of moisture in the atmosphere adheres to the dangling bonds. Accordingly, an OH group or the like is coupled to Si, resulting in an increase of the dielectric constant of the interlayer insulating film. To solve this problem, there has been known a method including: forming a recess in an interlayer insulating film; supplying an organic gas containing, e.g., Si and C (carbon) to a wafer while heating the wafer in a chamber of a heat treating apparatus which is different from a chamber for performing a plasma processing; and performing a recovery process for substituting the OH group with, e.g., a methyl group.

However, Cu exposed by etching the stopper film may be mixed with, e.g., O or F in the processing gas used for the etching process. Further, deposits containing F and the aforementioned moisture may be deposited on the surface. Thus, if the conductive layer is buried in this recess, a part of the conductive layer is oxidized or fluorinated and becomes copper oxide or copper fluoride. Accordingly, the resistance of the conductive layer increases, and electrical characteristics of a semiconductor device deteriorate. When the wafer having the copper oxide or the copper fluoride is cleaned by a liquid chemical, the copper oxide or the copper fluoride is removed and, therefore, the wiring layer becomes thin. Further, HF (hydrogen fluoride) is generated by reaction between the copper fluoride or the deposits containing F and the moisture in the atmosphere or the liquid chemical. Hence, the Cu wirings are dissolved, and disconnected. If the recovery process is performed on the wafer to which the moisture adheres, a hydrophobic by-product such as silanol may be generated by reaction between the recovery process gas and the moisture. Since it is difficult to remove the silanol by the cleaning process, the electrical resistance of the semiconductor device is increased. Hence, in order to obtain a semiconductor device containing small damages in an interlayer insulating film and a small amount of oxide in a wiring layer, a complicated process is required and this may decrease a throughput. Patent Documents 3 and 4 describe therein a technique for performing a reduction process on the wiring layer. However, the above-described problems are not described in Patent documents 3 and 4.

Patent Document 1: Japanese Patent Laid-open Publication No. 2007-250861
Patent Document 2: Japanese Patent Laid-open Publication No. 2007-80850 (paragraph [0008])
Patent Document 3: Japanese Patent Laid-open Publication No. 2006-019601
Patent Document 4: Japanese Patent Laid-open Publication No. 2009-164471

BRIEF SUMMARY OF THE INVENTION

In view of the forgoing, the present disclosure provides a substrate processing method for producing a semiconductor device having a small amount of oxide in a metal wiring and small damages on a low-k film containing carbon and oxygen with a high throughput and a storage medium for storing therein the substrate processing method.

In accordance with an aspect of the present disclosure, there is provided a substrate processing method for manufacturing a semiconductor device. The substrate processing method includes: a reducing process for reducing an oxide of a metal layer by supplying a reducing gas into a processing chamber accommodating therein a substrate in which a low-k film containing carbon and oxygen and the metal layer having an oxidized surface are exposed and a damaged layer from which carbon has been eliminated is formed on the exposed surface of the low-k film; and a recovery process for recovering the damaged layer by supplying a recovery process gas containing carbon to the substrate. Here, the reducing process and the recovery process may be consecutively performed in the common processing chamber.

Desirably, the substrate may include the low-k film having an opening; a stopper film containing silicon; and the metal layer which are layered in this sequence from the top. The substrate processing method may further include an etching process for exposing the metal layer by etching the stopper film by way of supplying plasma of a processing gas containing oxygen and fluorine via the opening to the stopper film, prior to the reducing process and the recovery process. Here, the etching process may be performed in a processing chamber different from the processing chamber for performing the reducing process and the recovery process. Desirably, in case that the recovery process gas and the low-k film contain silicon, the reducing process may be performed prior to the recovery process.

In accordance with another aspect of the present disclosure, there is provided a storage medium for storing therein a computer program used in a substrate processing apparatus for processing a substrate. In the substrate, a low-k film containing carbon and oxygen and a metal layer having an oxidized surface are exposed and a damaged layer from which carbon has been eliminated is formed on the exposed surface of the low-k film. Here, the computer program may include processes for executing the substrate processing method.

In accordance with the present disclosure, the reducing process and the recovery process are performed in the common processing chamber by supplying the reducing gas and the recovery process gas containing carbon to the substrate. Here, in the substrate, the low-k film containing carbon and oxygen and the metal layer having the oxidized surface are exposed and the damaged layer from which carbon has been eliminated is formed on the exposed surface of the low-k film. Thus, a semiconductor device containing a small amount of oxide in the metal wiring and small damages on the low-k film can be fabricated with a high throughput. Moreover, in case that silicon is contained in the recovery process gas and the low-k film, the generation of hydrophobic silanol by reaction between silicon contained in the recovery process gas and moisture in the atmosphere can be suppressed by consecutively performing the reducing process and the recovery process in sequence. As a result, the increase of the electrical resistance of the semiconductor device can be suppressed.

BRIEF DESCRIPTION OF THE DRAWINGS

FIGS. 2A to 2F are schematic diagrams illustrating a process flow of the substrate processing method.

DETAILED DESCRIPTION OF THE INVENTION

Structure of Wafer

Figure 1:
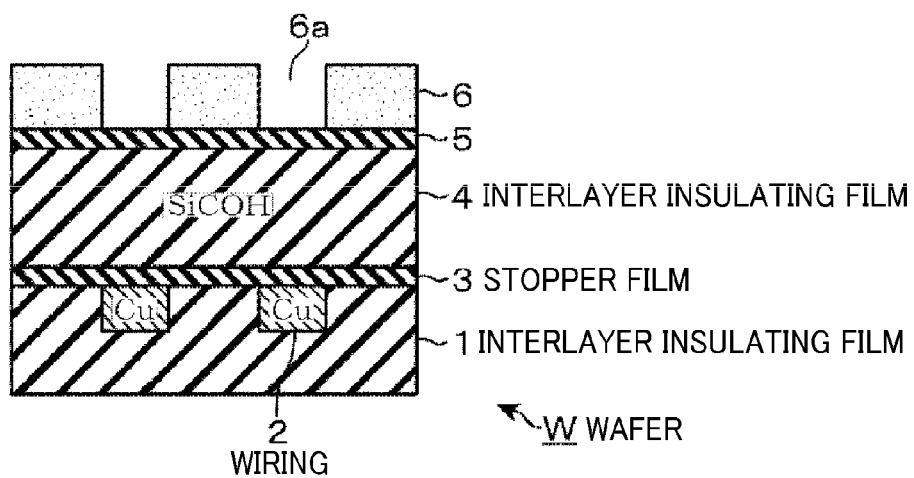
FIG. 1 is a vertical cross sectional view showing an example of a substrate to which a substrate processing method of the present disclosure is applied.

Prior to the explanation on a substrate processing method in accordance with an embodiment of the present disclosure, an example of a semiconductor wafer (hereinafter, referred to as a 'wafer') W as a substrate which is used for manufacturing a semiconductor device and processed by the substrate processing method will be described with reference to FIG. 1. FIG. 1 is an enlarged view showing a part of a cross section of the wafer W and shows a state in which an upper circuit layer ($(n+1)^{th}$ layer) is layered on a lower circuit layer ($n^{th}$ layer) formed on the wafer W. By way of example, the lower circuit layer has a structure in which two separated wirings 2 made of a metal such as Cu (copper) are buried side by side in the interlayer insulating film 1 formed of, e.g., SiCOH containing silicon, carbon, oxygen and hydrogen. A stopper film 3 containing Si such as SiCN (silicon carbonitride) is formed on the wirings 2 (the interlayer insulating film 1) in order to form holes (which will be described later) 21 having a uniform depth within the wafer W and protect the wirings 2 from corrosion caused by an organic film 7 buried in the corresponding holes 21. Although not shown, the wirings 2 are connected to wirings (not shown) buried in a circuit layer ($(n-1)^{th}$ layer) formed below the wirings 2. Further, although not shown, a barrier film for preventing diffusion of metal is formed between the SiCOH film 1 and the wirings 2.

An interlayer insulating film 4 as a low-k film formed of SiCOH, an inorganic film 5 formed of, e.g., silicon oxide, and an organic photoresist film 6 are layered in sequence from the bottom on the stopper film 3. Formed in the photoresist film 6 are openings 6a for forming the holes 21 to be described later in the interlayer insulating film 4 above the wirings 2.

[Process Flow]

Hereinafter, a flow of processes performed on the wafer W will be described with reference to FIGS. 2A to 2F and FIGS. 5A and 5B. First of all, in a processing chamber for performing a plasma process, a processing gas containing, e.g., $CF_4$ gas, $O_2$ (oxygen) gas and Ar (Argon) gas, is excited into plasma, and the plasma is supplied to the wafer W. As shown in FIG. 2A, the interlayer insulating layer 4 and the inorganic film 5 are etched by this plasma while using the photoresist film 6 as a mask. As a consequence, the holes (openings) 21 are formed. The etching is performed under conditions in which an etching ratio of the interlayer insulating film 4 to the stopper film 3 is large (the etching rate of the interlayer insulating film 4 is higher than that of the stopper film 3). Hence, the depth positions of the holes 21 is the same as the upper end positions of the stopper film 3 of the wafer W.

Next, the photoresist film 6 is removed by performing an asking process using plasma of, e.g., $O_2$ gas. Thereafter, the organic film 7 is coated so as to cover the inner areas of the holes 21 and the surface of the wafer W and then is hardened. As illustrated in FIG. 2B, a silicon oxide film 8, an anti-reflection film 9 and a photoresist film 10 are layered in sequence from the bottom on the surface of the organic film 7.

Thereafter, as depicted in FIG. 2C, a pattern 24 having a groove-shaped opening is formed in the photoresist film 10 so as to cover two holes 21. Next, the organic film 7 below the photoresist film 10 (the anti-reflection film 9) is exposed by etching the silicon oxide film 8 via the pattern 24 by way of using plasma of a processing gas containing, e.g., F. Since the anti-reflection film 9 is thin, the anti-reflection film 9 is etched together with the silicon oxide film 8.

Then, a plasma etching process is performed using a processing gas containing, e.g., O, thereby removing the photoresist film 10 from the surface of the wafer W and exposing the silicon oxide film 8 to which the pattern 24 has been transferred. As a result of this etching process, the organic film 7 exposed under the silicon oxide film 8 is etched while using the silicon oxide film 8 as a mask. The etching process is carried out until the height position of the surface of the organic film 7 reaches substantially the center position in the depth direction of the holes 21, for example. Next, a plasma etching process is performed using a processing gas containing F, so that the silicon oxide film 8 whose surface is exposed, the inorganic film 5 and the interlayer insulating film 4 are removed. As described in FIG. 2D, the interlayer insulating film 4 is etched such that the height position of the organic film 7 in the holes 21 is the same as that of the interlayer insulating film 4. As a result, a line-shaped groove 22 is formed on an upper side of the two holes 21. The anti-reflection film 9 is also etched and removed together with the silicon oxide film 8, the inorganic film 5 and the interlayer insulating film 4.

Next, as shown in FIG. 2E, an ashing processing is performed using plasma of a processing gas containing O, so that the organic film 7 on the surface of the wafer W and inside the holes 21 is removed. As a result of the ashing process, a recess 23 including the holes 21 and the groove 22 is formed in the interlayer insulating film 4. At this time, if the interlayer insulating film 4 contacts with the plasma containing O, a damaged layer 15 from which C has been eliminated is formed on the surface (exposed surface) of the interlayer insulating film 4. Further, in the process of forming the groove 22 as shown in FIG. 2D, the damaged layer 15 has been formed on the interlayer insulating film 4 which contacts with the plasma. However, the description thereof is omitted.

Thereafter, the stopper film 3 is etched by plasma of a processing gas containing F and O until the lower end position of the recess 23 (the holes 21) becomes close to the surfaces of the wirings 2. Then, as illustrated in FIG. 2F, the stopper film 3 is over-etched by plasma of a processing gas containing, e.g., Ar (argon) gas; at least one of $CF_4$ gas, $CHF_3$ gas, $CH_2F_2$ gas and $C_4F_8$ gas; and at least one of $O_2$ (oxygen) gas and $CO_2$ (carbon dioxide) gas under the processing conditions in which the introduction (diffusion) of F to the wirings 2 and the generation of deposits containing F can be minimized. In other words, the stopper film 3 is etched under the etching conditions in which the etching ratio of the stopper film 3 to the wirings 2 is large (the etching rate of the stopper film 3 is higher than that of the wirings 2 until the lower end of the holes 21 is the same as the upper ends of the wirings 2 of the wafer W.

Figure 3:
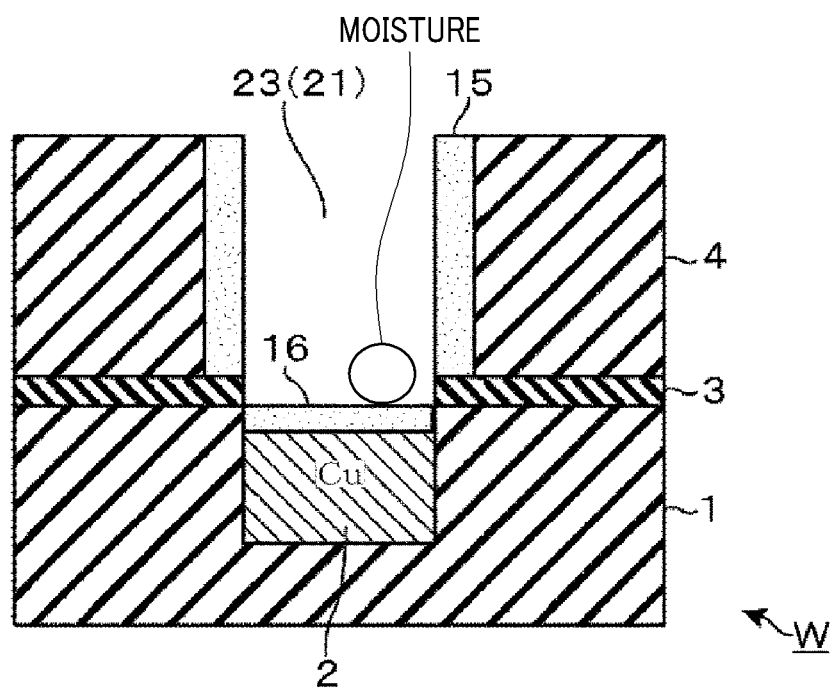
FIG. 3 is a schematic diagram illustrating a process flow of the substrate processing method.

At this time, F is contained in the processing gas, so that the deposits containing F are likely to be deposited inside the recess 23. However, by setting such processing conditions as described above, it is possible to prevent the deposits containing F from being deposited on the surface of the wafer W (inside the recess 23) or greatly reduce the amount of deposits. Further, since O and F are contained in the processing gas, when the wirings 2 are exposed by etching the stopper film 3, the O or F is introduced into the surfaces of the wirings 2, thus forming an oxide/fluoride layer 16 containing copper oxide or copper fluoride as illustrated in FIG. 3. The concentration of fluorine in the oxide/fluoride layer 16 can be greatly reduced by setting the processing conditions such that fluorine hardly remains in the wafer W as described above. In addition, since F is contained in the processing gas, the inorganic film 5 containing Si on the interlayer insulating film 4 is also etched and becomes thin. FIG. 3 illustrates an enlarged view of one of the holes 21.

Figure 4:
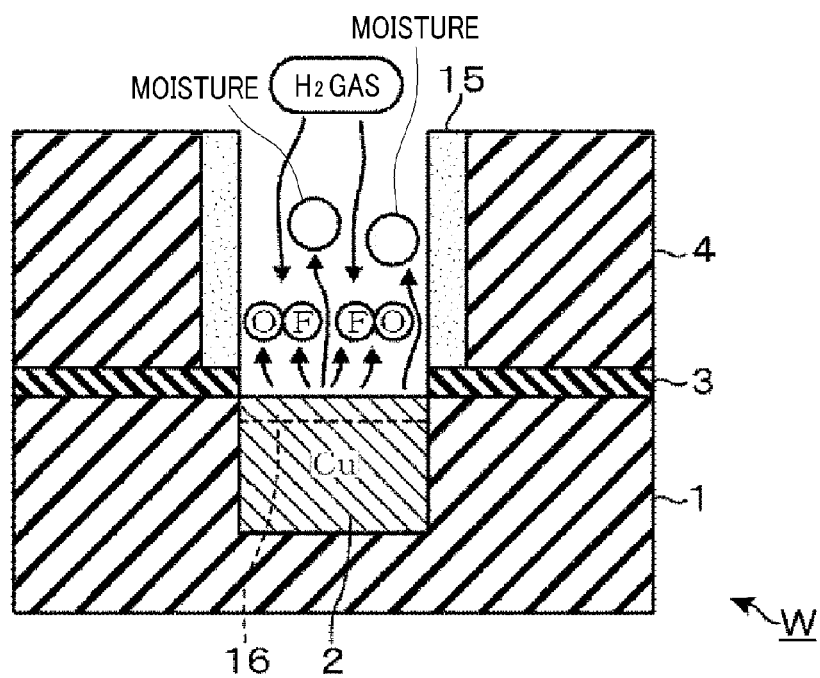
FIG. 4 is a schematic diagram illustrating a process flow of the substrate processing method.
Figure 5A:
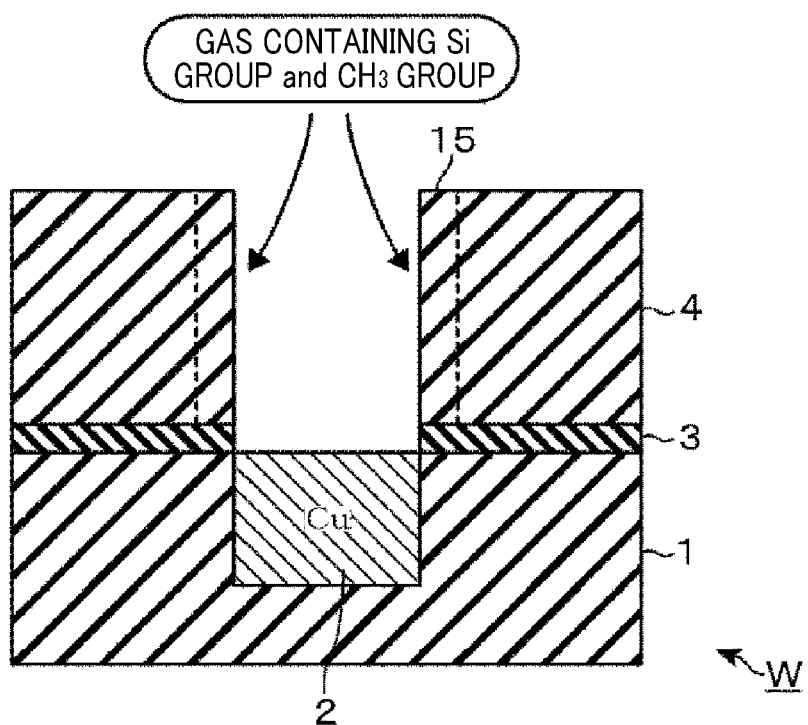
FIGS. 5A and 5B are schematic diagrams illustrating a process flow of the substrate processing method.
Figure 5B:
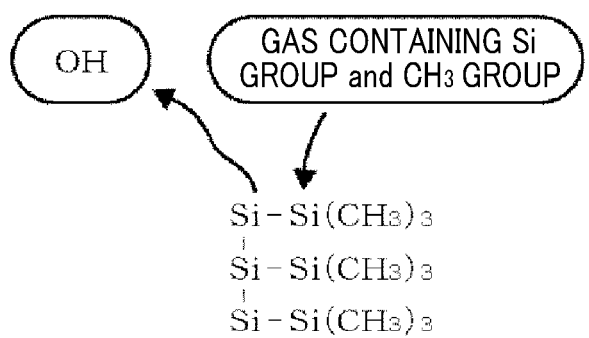

Next, by way of example, when the wafer W is transferred to a processing chamber for performing a recovery process under a vacuum atmosphere, moisture in the atmosphere adheres to the surfaces of the wirings 2 (the surface of the oxide/fluoride layer 16), as illustrated in FIG. 3. Moreover, the moisture in the atmosphere reacts with Si in the damaged layer 15, so that Si—OH bonds are created. In the processing chamber, when a reducing process for heating the wafer W to about 250° C. is performed while supplying $H_2$ (hydrogen) gas, the moisture adhering to the surfaces of the wirings 2 (the oxide/fluoride layer 16) is evaporated, and O or F is removed by the reduction of the oxide/fluoride layer 16, as can be seen from FIG. 4.

Upon completion of the reducing process, the recovery process of the wafer W (the interlayer insulating film 4) is performed in the processing chamber in which the above-described reducing process has been performed. By way of example, if a recovery process gas containing Si group and $CH_3$ group such as TMSDMA (N-Trimethylsilyldimethylamine) gas is supplied while heating the wafer W to about 150° C. to 300° C., the OH group in the damaged layer 15 is substituted by an organic material containing $CH_3$ group contained in the recovery process gas, as can be seen from FIGS. 5A and 5B. In this manner, the recovery process of the damaged layer 15 is carried out. Thereafter, the wafer W is unloaded from the substrate processing apparatus in which a series of processes has been performed, and then is cleaned by a liquid chemical. Thereafter, a metal film is buried in the recess 23 by, e.g., a sputtering method, via a barrier film for preventing diffusion of a metal.

[Configuration of Apparatus]

Figure 6:
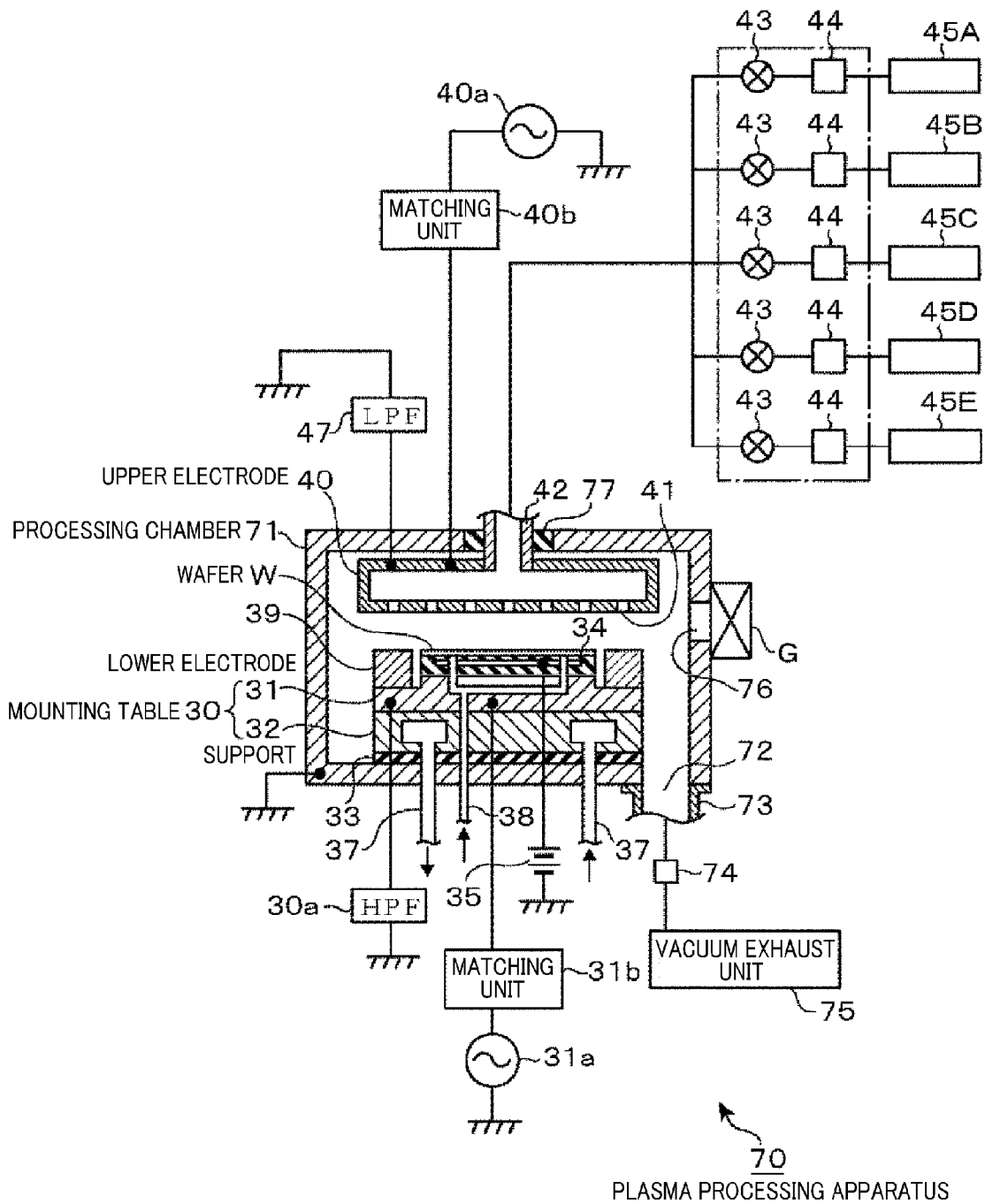
FIG. 6 is a vertical cross sectional view showing an example of an apparatus used in the substrate processing method.
Figure 7:
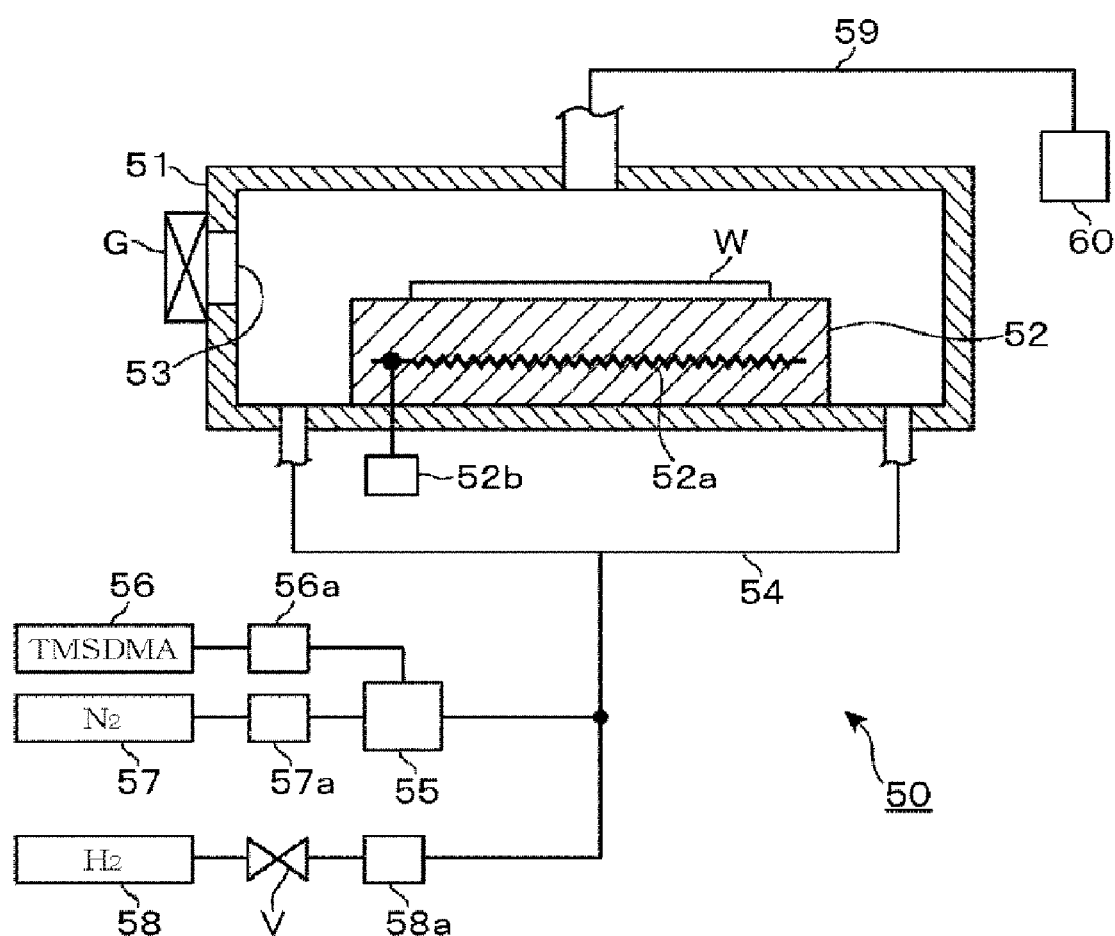
FIG. 7 is a vertical cross sectional view showing an example of the apparatus used in the substrate processing method.

Hereinafter, an example of the substrate processing apparatus for performing the above-described process will be described with reference to FIGS. 6 to 8. First of all, a parallel plate type plasma processing apparatus 70 for performing plasma processing such as etching or asking will be described. The plasma processing apparatus 70 includes: a processing chamber 71 for performing a plasma process; a mounting table 30 which is installed in the processing chamber 71 and mounts thereon a wafer W; and an upper electrode 40 serving as a gas shower head which is installed at a ceiling of the processing chamber 71 so as to face the wafer W on the mounting table 30. A vacuum exhaust unit 75 including a vacuum pump or the like is connected to a gas exhaust line 73 extending from a gas exhaust port 72 provided on a bottom surface of the processing chamber 71 via a pressure control unit 74 such as a butterfly valve. Formed on a wall of the processing chamber 71 is a transfer port 76 for the wafer W which is opened and closed by a gate valve G. Further, the processing chamber 71 is grounded.

The mounting table 30 includes a lower electrode 31 and a support 32 for supporting the lower electrode 31 on a lower side. The mounting table 30 is installed on the bottom surface of the processing chamber 71 via an insulation member 33. An electrostatic chuck 34 for electrostatically attracting the wafer W onto the mounting table 30 by a voltage applied from a high voltage DC power supply 35 is installed on the mounting table 30. In FIG. 6, a reference numeral 37 denotes a temperature control medium path through which a temperature control medium for controlling a temperature of the wafer W on the mounting table 30 passes, and a reference numeral 38 denotes a gas channel for supplying, as a backside gas, a thermally conductive gas such as He (helium) gas to the backside of the wafer W on the mounting table 30. For instance, the temperature of the wafer W is controlled to about 20° C. by the temperature control medium path 37 and the gas channel 38 during the plasma process.

The lower electrode 31 is grounded via a high pass filter (HPF) 30a. A high frequency power supply 31a of about 2 MHz frequency is connected to the lower electrode 31 via a matching unit 31b in order to attract ions in the plasma to the surface of the wafer W by applying a bias power to the wafer W. A focus ring 39 surrounding the electrostatic chuck 34 is installed at the outer peripheral portion of the lower electrode 31 to thereby focus the plasma toward the wafer W mounted on the mounting table 30.

The upper electrode 40 has a hollow portion, and a plurality of gas discharge holes 41 for distributing the processing gas into the processing chamber 71 is provided in the bottom surface of the upper electrode 40. Furthermore, a gas inlet line 42 serving as a gas supply line is provided at the central portion of the top surface of the upper electrode 40. The gas inlet line 42 is branched at its upstream side into five lines respectively connected to gas supply sources 45A to 45E via valves 43 and flow rate control units 44. The gas supply sources 45A to 45E correspond to, e.g., a $CF_4$ gas source, a $CHF_3$ gas source, a $CO_2$ gas source, an $O_2$ gas source and an Ar gas source, respectively. A reference numeral 77 in FIG. 6 denotes an insulating member formed between the gas inlet line 42 and the processing chamber 71. The upper electrode 40 is grounded via a low pass filter (LPF) 47. A high frequency power supply 40a of about 60 MHz frequency for exciting a processing gas into plasma is connected to the upper electrode 40 via a matching unit 40b.

Hereinafter, a heat treatment apparatus 50 for performing a reducing process and a recovery process will be described with reference to FIG. 7. The heat treatment apparatus 50 includes a processing chamber 51 and a mounting table 52 which is installed in the processing chamber 51 and mounts thereon the wafer W. A heater 52a serving as a heating unit is installed in the mounting table 52. The heater 52a is configured to heat the wafer W to about 50° C. to 200° C. by power supplied from a power supply 52b. Elevating pins (not shown) are installed at the mounting table 52 and are configured to transfer the wafer W between the mounting table 52 and a transfer unit (not shown) via a transfer port 53 formed in the sidewall of the processing chamber 51. Moreover, a notation G denotes a gate valve.

The bottom surface of the processing chamber 51 has, e.g., four openings to surround the mounting table 52 at a same distance in a circumferential direction of the processing chamber 51. One end of the gas supply line 54 is connected to the four openings. Moreover, the other end of the gas supply line 54 is connected to a vaporizer 55. The upstream side of the vaporizer 55 is connected with a TMSDMA source 56 and a nitride gas source 57 via flow rate control units 56a and 57a, respectively. The liquid TMSDMA is vaporized by the vaporizer 55 and the TMSDMA as an organic gas for a recovery process is supplied into the processing chamber 51 by using a nitride gas as a carrier gas. In addition, a gas source 58 for storing therein a gas such as $H_2$ (hydrogen) gas for reducing process is connected with the gas supply line 54 via a valve V and a flow rate control unit 58a. A vacuum pump 60 having a pressure control unit (not illustrated) is connected with a ceiling wall, facing the wafer W on the mounting table 52, of the processing chamber 51 via a gas exhaust line 59.

Figure 8:
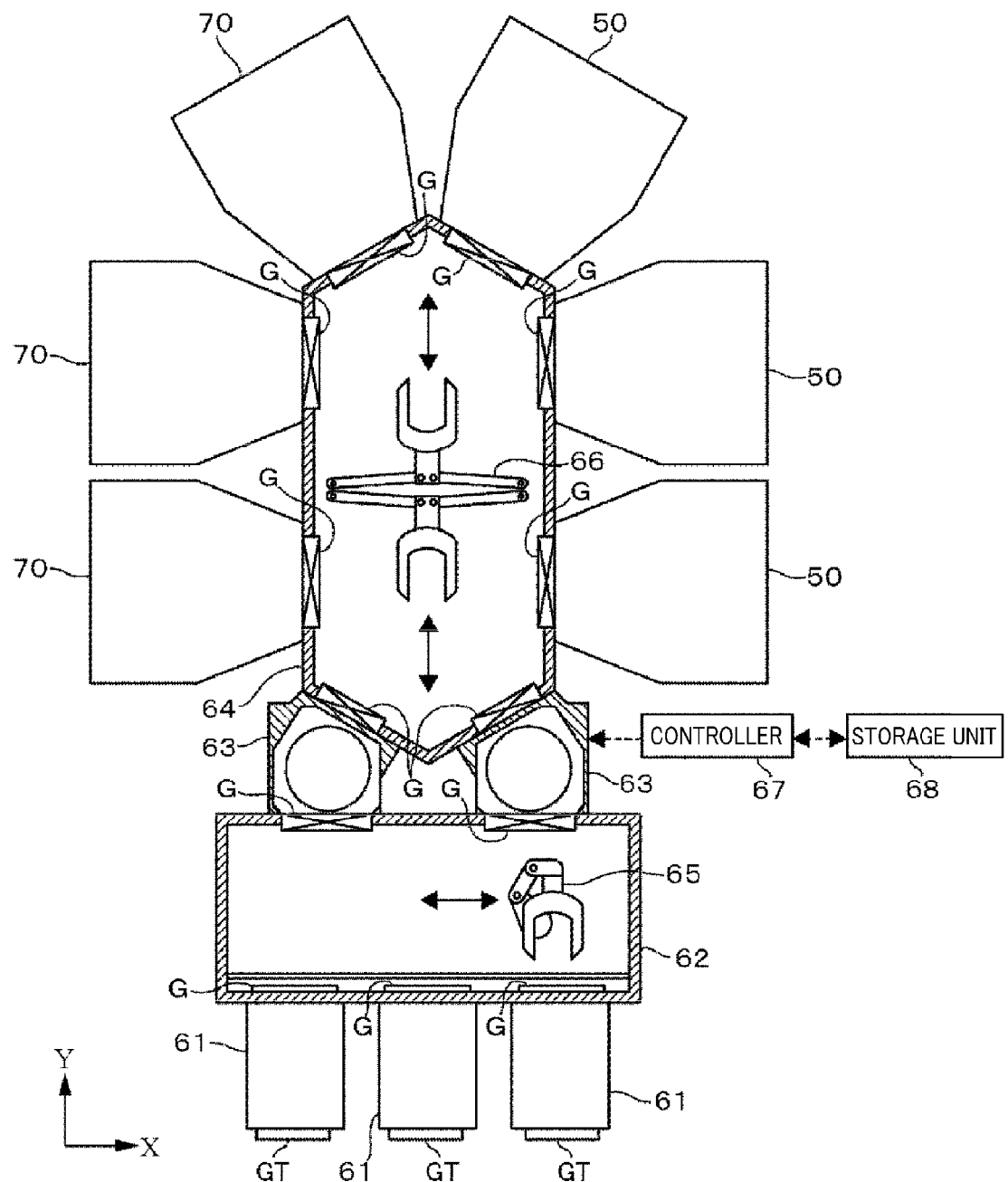
FIG. 8 is a top view showing an example of the apparatus used in the substrate processing method.

As described in FIG. 8, the plasma processing apparatus 70 and the heat treatment apparatus 50 are included in a substrate processing apparatus of a multi-chamber system. This substrate processing apparatus includes a mounting table 61 for mounting thereon a FOUP accommodating therein a plurality of wafers W, a first transfer chamber 62 in an atmospheric atmosphere, a load-lock chamber 63, and a second transfer chamber 64 in a vacuum atmosphere. The plasma processing apparatuses 70 and the heat treatment apparatuses 50 are airtightly connected with the second transfer chamber 64 at six ports.

A transfer arm 65 serving as a first transfer unit for transferring the wafer W between the FOUP on the mounting table 61 and the load-lock chamber 63 is installed in the first transfer chamber 62. A transfer arm 66 serving as a second transfer unit for transferring the wafer between the load-lock chamber 63, the plasma processing apparatuses 70 and the heat treatment apparatuses 50 is installed in the second transfer chamber 64.

By way of example, the substrate processing apparatus is provided with a controller 67 including a computer. The controller 67 includes a program, a memory, a data processing unit such as CPU. The program has instructions which instruct the controller 67 to send control signals to each unit of the substrate processing apparatus and perform each step to be describes later. The memory has an area for storing therein processing parameters such as a processing pressure, a processing temperature, a processing time, a gas flow rate, or a power value. This program (including a program for input operation and display of the processing parameters) is stored in a storage unit 68 as a computer storage medium such as a flexible disk, a compact disk, a hard disk, an MO (magneto-optical disk) or the like, and then is installed in the controller 67.

Hereinafter, a flow of processes performed on the wafer W in the substrate processing apparatus will be briefly described. First of all, the FOUP accommodating therein the wafer W is mounted on the mounting table 61, and the wafer W is unloaded from the FOUP and transferred into the load-lock chamber 63 by the transfer arm 65. Next, the wafer W is mounted on the mounting table 30 of the plasma processing apparatus 70 by the transfer arm 66, and the gate valve G is airtightly closed. The inside of the processing chamber 71 is evacuated by the vacuum exhaust unit 75 and maintained at a predetermined vacuum level and, then, the processing gas is supplied from the gas inlet line 42. Next, the processing gas is excited into plasma by supplying a high frequency power to the upper electrode 40, and ions in the plasma are attracted toward the wafer W by supplying a bias high frequency power to the lower electrode 31. Once the plasma of the processing gas is supplied to the wafer W, the above-described etching process is carried out.

Thereafter, the supply of the high frequency power and the processing gas is stopped, and the inside of the processing chamber 71 is evacuated. The processing gas is changed, and the above-described asking process is performed using the changed processing gas. Next, the wafer W is unloaded from the processing chamber 71 by the transfer arm and a process of forming the photoresist film 10 is performed. Then, the wafer W is returned back to the substrate processing apparatus and a series of plasma processes are performed on the wafer W. Thereafter, the wafer W is loaded into the processing chamber 51 of the heat treatment apparatus 50. The reducing process is performed by supplying a reducing gas ($H_2$ gas) to the wafer W while heating the wafer W on the mounting table 52 to a predetermined temperature, e.g., about 250° C. and maintaining the pressure in the processing chamber 51 at a predetermined level.

Next, the supply of the reducing gas is stopped, and the inside of the processing chamber 51 is evacuated. The processing gas is changed to a gas for the recovery process, and the recovery process gas is supplied to the wafer W heated to about 250° C. at a certain pressure. In this manner, the reducing process and the recovery process are consecutively performed on the wafer W in the common processing chamber 51. When the series of processes performed on the wafer W is completed or when the wafer W is unloaded to the outside so as to form the photoresist film on the wafer W, the wafer W is transferred to the original FOUP by the transfer arms 66 and 65.

In accordance with the above-described embodiment, the reducing gas and the recovery process gas containing carbon are supplied to the wafer W in the common processing chamber 51. Here, in the wafer W, the damaged layer 15 from which carbon has been eliminated and the oxide/fluoride layer 16 are formed on the exposed surfaces of the interlayer insulating film 4 and the wirings 2, respectively. Therefore, time required for the temperature increase (temperature control) of the wafer W may be shortened as compared to a case in which the reducing process and the recovery process are performed in the plasma processing chamber 71 at a low processing temperature (temperature in the case of supplying plasma). Furthermore, time required to transfer the wafer W can be reduced as compared to a case in which the reducing process and the recovery process are performed in different processing chambers. Accordingly, a semiconductor device having a small amount of oxide in the wirings 2 and small damages on the interlayer insulating film 4 can be fabricated with a high throughput. Besides, by consecutively performing the reducing process and the recovery process in the common processing chamber 51, the effects of moisture from the atmosphere during the transfer of the wafer W can be suppressed, and the processing chamber 51 can be effectively utilized, for example. As a result, it is possible to quickly produce a semiconductor wafer in which the increase of the dielectric constant of the interlayer insulating film 4 and the increase of the electrical resistance of the wirings 2 are suppressed.

When the processing gas containing Si is used for the recovery process, hydrophobic silanol that is hardly removed by a cleaning process may be generated due to reaction between the Si and the moisture adhering to the surface of the wafer W. However, the increase of the electrical resistance by the generation of silanol can be suppressed by performing the reducing process prior to the recovery process.

By way of example, even when the moisture in the atmosphere adheres to the wirings 2 during the transfer of the wafer W in the second transfer chamber 64, the moisture can be removed by the reducing process that heats the wafer W. Thus, generation of hydrogen fluoride (HF) by reaction between moisture and F in the deposits or the oxide/fluoride layer 16 can be suppressed. Accordingly, it is possible to prevent disconnection of the conductive line which is caused by dissolution of the metal layer buried in the recess 23 or the wirings 2 into the hydrogen fluoride. Further, by performing the reducing process of the oxide/fluoride layer 16, the dissolution of the oxide/fluoride layer 16 (copper oxide) can be suppressed even in the case of performing the cleaning process by using a chemical liquid after the recovery process. Therefore, the decrease of the wirings 2 can be suppressed.

In a conventional method, a processing gas which does not contain or contains only a small amount of O ($O_2$ gas or $CO_2$ gas), e.g., CF-based gas, is used for etching the stopper film 3 in order to minimize damages on the interlayer insulating film 4 and the wirings 2 (elimination of carbon from the interlayer insulating film 4 or oxidation of the wirings 2). Hence, in the conventional method, a large amount of F is introduced into the surfaces of the wirings 2. As a consequence, a large amount of strongly bonded (hardly reducible) fluoride is generated, and deposits containing F are deposited to the surface of the wafer W.

In accordance with the present disclosure, since the reducing process is performed, the stopper film can be etched under conditions in which a larger amount of oxide that is easily reduced compared to fluoride is generated. In other words, since the processing gas containing F needs to be used for etching the stopper film 3 containing Si, the processing conditions of the present disclosure are controlled such that the stopper film 3 can be etched by O and a minimum amount of F. Here, the amount of O is increased compared to the conventional case, so that damages on the interlayer insulating film 4 may be increased. However, the damages can be removed by a recovery process to be performed later. Moreover, the oxide/fluoride layer 16 formed on the wirings 2 contains a large amount of oxide that is easily reducible and, thus, the oxide/fluoride layer 16 can be easily reduced. In this way, by controlling the processing conditions as described above, deposits containing F are hardly generated on the surface of the wafer W. Therefore, the generation of hydrogen fluoride by reaction between F in the deposits and moisture can be suppressed and, also, the increase of the electrical resistance of the conductive line caused by the deposits can be suppressed. Besides, since the reducing process and the recovery process are performed in the common processing chamber 51 as described above, the footprint of the apparatus can be reduced as compared to the case of installing different dedicated processing chambers.

The above-described interlayer insulating film 4 may be, e.g., MSQ (methyl-hydrogen-SilsesQuioxane) (either porous or dense) formed by a SOD (Spin on Dielectric) device, a SiOC-based film as one of inorganic insulating films formed by CVD (Chemical Vapor Deposition) (the SiOC-based film having a Si—$CH_3$ bond is obtained by introducing a methyl group (—$CH_3$) to an Si—O bond of a conventional $SiO_2$ film; Black Diamond (Applied Materials Corp.), Coral (Novellus Systems Inc.), Aurora (ASM International N.V.) and the like are examples of the SiOC-based film; and both porous one and dense one are available). In addition, a film containing C, O and H without Si such as SiLK can also be used as the interlayer insulating film 4, and the technique of the present disclosure can also be applied thereto. Further, the stopper film 3 may be a film containing Si such as an SiC film or an SiN film. A metal for forming the wirings 2 may be, e.g., W (tungsten) or the like, in addition to Cu.

As for the processing gas used for the recovery process, it is possible to use, in addition to the TMSDMA, a gas having a methyl group (—$CH_3$), e.g., a silylation agent such as DMSDMA (Dimethylsilyldimethylamine), TMDS (1,1,3,3-Tetramethyldisilazane), TMSPyrole (1-Trimethylsilylpyrole), BSTFA (N,O-Bis(trimethylsilyl)trifluoroacetamide), BDMADMS (Bis(dimethylamino)dimethylsilane) or the like. Further, the processing gas may be DPM (Dipivaloyl Methane), DMC (Dimethylcarbonate), acetyl acetone or the like. Therefore, when the recovery process is performed by using a processing gas which does not contain Si, silanol is not generated by the recovery process. For that reason, the recovery process can be performed prior to the reducing process. Furthermore, as for a reducing gas used for a reducing process, CO (carbon monoxide) gas may be used instead of or in addition to $H_2$ gas. Although the reducing process and the recovery process are performed in the common heat treatment apparatus 50, those processes can be performed in different heat treatment apparatuses 50.

Figure 9:
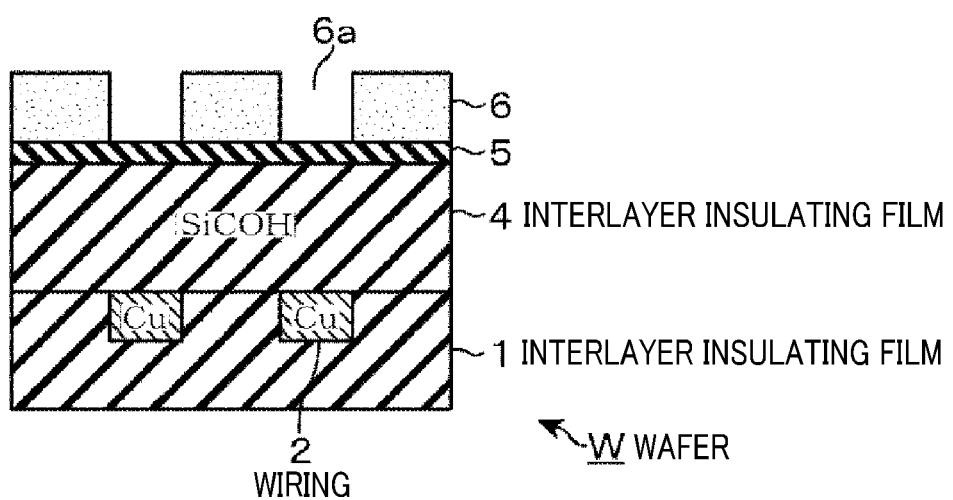
FIG. 9 is a vertical cross sectional view showing another example of the substrate to which the substrate processing method is applied.

The above example has described the case of processing the wafer W in which the stopper film 3 is formed between the upper and the lower interlayer insulating films 1 and 4. However, the present disclosure is also applicable to the case of processing a wafer W in which the stopper film 3 is not formed as shown in FIG. 9. In this case as well, a processing gas containing F and O is used for forming the holes 21 in the upper interlayer insulating film 4, and the damaged layer 15 and the oxide/fluoride layer 16 are formed on the interlayer insulating film 4 and the wirings 2, respectively.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

What is claimed is:

1. A substrate processing method for manufacturing a semiconductor device, a substrate including a low-k film having an opening, a stopper film containing silicon, and a metal layer which are layered in this sequence from the top, the substrate processing method comprising:
   coating an organic film within the opening of the low-k film;
   etching the organic film using a processing gas containing oxygen and etching the low-k film using a processing gas containing fluorine;
   performing an ashing process using plasma of a processing gas containing oxygen to remove the organic film and forming a damaged layer from which carbon has been eliminated on an exposed surface of the low-k film by the plasma of the processing gas containing oxygen;
   etching the stopper film by way of supplying plasma of a processing gas containing oxygen and fluorine via the opening to the stopper film to expose the metal layer;
   reducing an oxide of the metal layer by supplying a reducing gas into a processing chamber accommodating therein the substrate in which the low-k film containing carbon and oxygen and the metal layer having an oxidized surface are exposed; and
   recovering the damaged layer by supplying a recovery process gas containing carbon to the substrate,
   wherein the reducing process and the recovery process are consecutively performed in the common processing chamber.

2. The substrate processing method of claim 1, wherein the step of etching the stopper film is performed in a processing chamber different from the processing chamber for performing the step of reducing and the step of recovering.

3. The substrate processing method of claim 2, wherein the recovery process gas and the low-k film contain silicon, and the step of reducing is performed prior to the recovery process.

4. A storage medium for storing therein a computer program used in a substrate processing apparatus for processing a substrate in which a low-k film containing carbon and oxygen and a metal layer having an oxidized surface are exposed and a damaged layer from which carbon has been eliminated is formed on the exposed surface of the low-k film, wherein the computer program includes processes for executing the substrate processing method as claimed in claim 2.

5. The substrate processing method of claim 1, wherein the recovery process gas and the low-k film contain silicon, and the step of reducing is performed prior to the recovery process.

6. A storage medium for storing therein a computer program used in a substrate processing apparatus for processing a substrate in which a low-k film containing carbon and oxygen and a metal layer having an oxidized surface are exposed and a damaged layer from which carbon has been eliminated is formed on the exposed surface of the low-k film, wherein the computer program includes processes for executing the substrate processing method as claimed in claim 1.

* * * * *

UNITED STATES PATENT AND TRADEMARK OFFICE
CERTIFICATE OF CORRECTION

Page 1 of 1

PATENT NO. : 8,870,164 B2
APPLICATION NO. : 13/008133
DATED : October 28, 2014
INVENTOR(S) : Wataru Shimizu It is certified that error appears in the above-identified patent and that said Letters Patent is hereby corrected as shown below:

In the Specification,

Column 6, line 27; Please delete "asking" and add -- ashing --

Column 8, line 42; Please add -- 66 -- after "arm"

Signed and Sealed this
Ninth Day of June, 2015

Michelle K. Lee
*Director of the United States Patent and Trademark Office*